United States Patent
Cunningham, Jr.

(10) Patent No.: US 7,696,941 B2
(45) Date of Patent: Apr. 13, 2010

(54) PRINTED CIRCUIT NOTCH ANTENNA

(75) Inventor: Charles Cunningham, Jr., Raleigh, NC (US)

(73) Assignee: Elster Electricity, LLC, Raleigh, NC (US)

(*) Notice: Subject to any disclaimer, the term of this patent is extended or adjusted under 35 U.S.C. 154(b) by 846 days.

(21) Appl. No.: 11/519,723

(22) Filed: Sep. 11, 2006

(65) Prior Publication Data

US 2008/0062055 A1    Mar. 13, 2008

(51) Int. Cl.
    *H01Q 13/10*    (2006.01)
(52) U.S. Cl. .................................. 343/767; 343/768
(58) Field of Classification Search ............ 343/702, 343/767, 768
    See application file for complete search history.

(56) References Cited

U.S. PATENT DOCUMENTS

| | | | |
|---|---|---|---|
| 4,853,704 A | 8/1989 | Diaz et al. ................ | 343/767 |
| 5,748,152 A | 5/1998 | Glabe et al. .............. | 343/767 |
| 5,966,010 A * | 10/1999 | Loy et al. ................ | 324/142 |
| 6,052,093 A | 4/2000 | Yao et al. ................ | 343/770 |
| 6,424,300 B1 | 7/2002 | Sanford et al. | |
| 6,507,321 B2 * | 1/2003 | Oberschmidt et al. ...... | 343/770 |
| 6,664,932 B2 | 12/2003 | Sabet et al. .............. | 343/770 |
| 6,791,498 B2 | 9/2004 | Boyle et al. .............. | 343/702 |
| 6,900,771 B1 | 5/2005 | Huang | |
| 7,170,446 B1 * | 1/2007 | West et al. ............... | 342/372 |
| 7,221,320 B2 * | 5/2007 | Sathath ................... | 343/700 MS |
| 2002/0000943 A1 * | 1/2002 | Oberschmidt et al. ...... | 343/767 |
| 2004/0058723 A1 | 3/2004 | Mikkola et al. .......... | 455/575.7 |
| 2006/0012491 A1 | 1/2006 | Mahowald | |
| 2006/0092086 A1 * | 5/2006 | Franson et al. ............ | 343/767 |
| 2006/0132373 A1 * | 6/2006 | Yuanzhu .................. | 343/767 |

OTHER PUBLICATIONS

Ryken, M. Dr., "Microstrip Antenna Size Reduction Using Slots", NAVAIR NAWCWD, Design Program Slide Presentation, Ansoft Corporation 1984-2001, 22 pages.
Smith, K., "Antennas for Low Power Applications", AN36/AN36A-070898, 16 pages.

* cited by examiner

*Primary Examiner*—HoangAnh T Le
(74) *Attorney, Agent, or Firm*—Woodcock Washburn LLP

(57) ABSTRACT

The embodiments contemplate a printed circuit board of at least two layers for providing remote wireless communication between a wireless device and a unit, as well as methods of creating an omni-directional radiation pattern for transmitting/receiving information using a notch antenna formed in the printed circuit board having radio frequency circuitry. The notch antenna, with a closed and opened end, may be etched or embedded into a ground plane conductor on a first layer of the board. A transmission line positioned on the bottom surface of a second layer of the board crosses under the portion of the board containing the notch antenna. A first and second intermediate layer electrically connected between the first layer and the second layer may serve as return ground planes for the transmission line. A capacitive circuit, positioned in series with the transmission line and across the notch antenna, functions to reduce and/or eliminate inductance of the transmission line.

34 Claims, 16 Drawing Sheets

PRINTED CIRCUIT NOTCH ANTENNA

TECHNOLOGY FIELD

The invention relates generally to antennas. More particularly, the invention relates to printed circuit notch antennas. The invention is particularly well suited to, but in no way limited to, use in devices with wireless capabilities, such as utility meters.

BACKGROUND

Various constraints in the design of meters that employ wireless radio transmitters and/or receivers restrict the type, size, and orientation of antennas that can be used in the metering devices. Such constraints include orientation and space restriction of meters. For example, a large portion of electricity meters are oriented vertically in a socket on a wall of a building. It is desirable to limit the size of the meter so that the meter does not extensively protrude from the wall on which it is located. It is also desirable to vertically mount printed circuit boards within the meter. The size constraint of limiting the outward protrusion of the meter from a wall coupled with the constraint of vertically mounting printed circuit boards within the meter makes it difficult to implement a conventional dipole, monopole, or loop antenna into a housing of such meters.

Another design constraint is a requirement that the antenna produce vertically-polarized electric fields in order to create effective omni-directional radiation coverage patterns. The internal implementation of conventional, vertically-polarized antennas with metering circuitry in a meter results in unfavorable consequences due to the close proximity of the antenna and the metering circuitry. For example, low gain and poor coverage patterns may result in such a situation where monopole, dipole, or loop antennas are incorporated.

Yet another constraint that may be encountered in the design of meters employing wireless capabilities is that external antennas are not practical, making the implementation of an internal antenna a necessity. External antennas may be easily implemented for metering devices but are extremely dangerous if human contact is encountered due to the high potential of service lines. Furthermore, external antennas are susceptible to unwanted tampering and accidental damage.

Problems with cross-talk and interference from electronic circuitry typically require separation and electrical isolation of the electronic circuitry from the ground and power planes of the printed circuit assembly. In order to accomplish the electrical isolation, separate assemblies are needed, which increases the size of the device incorporating the circuitry.

Accordingly, there is a need for the internal incorporation of an antenna into a metering device containing wireless functionalities without altering or adversely affecting the orientation or size of the metering device and for providing an effective omni-directional radiation coverage. The present invention satisfies one or more of these needs as well as other needs.

SUMMARY

The present invention provides a multi-layer printed circuit board with a first or top layer containing a first ground plane conductor and a second or bottom layer positioned beneath the first layer. The first layer and the second layer may be electrically connected by, for example, plated through-holes or vias. A notch antenna may be formed into the first ground plane conductor. For example, the notch antenna may be etched or embedded into the first ground plane conductor. The notch antenna has a closed end and an opened end. Two side portions of the notch antenna are positioned between the closed end and the opened end to form the notch antenna. A transmission line may be positioned on the surface opposite the surface containing the notch antenna of the printed circuit board and may cross under the portion of the printed circuit board containing the notch antenna. The transmission line connects to at least one of the side portions of the notch antenna through "vias" or resistive through-hole connections. The transmission line may be positioned along the side portion of the notch antenna.

Radio circuitry and/or metering circuitry may be included on the printed circuit board. The printed circuit board may be utilized for various metering functions, such as measuring consumption as well as relaying and transmitting various metering signals. The radio circuitry and the notch antenna are connected via the transmission line.

The multi-layer printed circuit board may mount to a standard socket on a base of a meter and may be self-contained within a housing of the meter. The printed circuit board may include a first intermediate layer and may additionally include a second intermediate layer. The first and second intermediate layers may serve as return ground planes for the transmission line.

Additionally, a capacitive circuit may be positioned in series with the transmission line and across the notch antenna. The capacitive circuit may function to reduce and/or eliminate the inductance of the transmission line. An additional capacitive circuit may be positioned near the opened end of the notch antenna. This additional capacitive circuit may function to tune the notch antenna to a desired operating frequency.

Other advantages and features of the invention are described below.

BRIEF DESCRIPTION OF THE DRAWINGS

The foregoing summary and the following detailed description of the invention are better understood when read in conjunction with the appended drawings. Exemplary embodiments of the invention are shown in the drawings, however, it is understood that the invention is not limited to the specific methods and instrumentalities depicted therein. In the drawings.

DETAILED DESCRIPTION OF ILLUSTRATIVE EMBODIMENTS

The present embodiments are directed to a printed circuit notch antenna employing a ground plane of a printed circuit board containing electrical components, such as for example metering and radio circuitry. The integration of the notch antenna into the ground plane of the printed circuit board advantageously eliminates the need required by typical monopole, dipole, and loop antennas to be separated and electrically isolated from the ground plane of printed circuit boards. The notch antenna does not need such a dedicated area of the printed circuit board, isolated from the ground plane, because the radiation from the notch antenna is produced by currents that circulate in the ground plane around the notch antenna. Thus, the notch antenna may be formed in a small and compact region of the printed circuit board. Additionally, because electrical isolation is not required in a printed circuit board employing a notch antenna in the ground place, electrical components, such as metering and radio circuitry, may be placed adjacent to the notch antenna. For example, the notch antenna and electronic circuitry may be located on the same printed circuit board.

Figure 1:
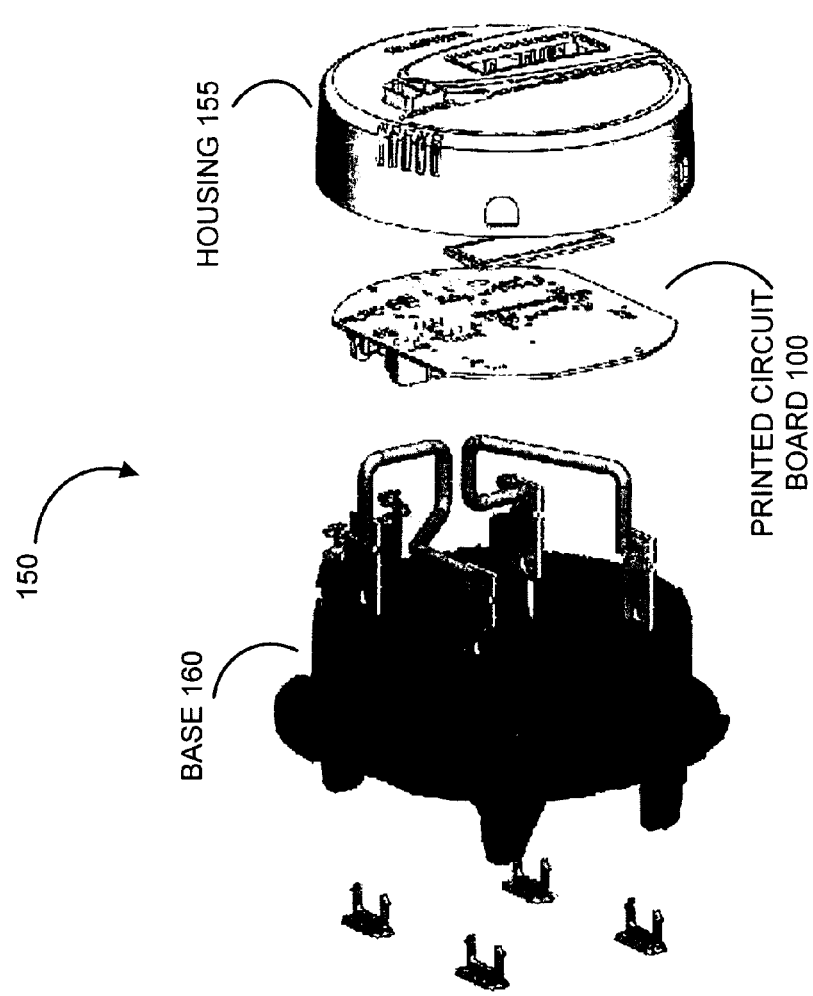
FIG. 1 is a diagram illustrating an exemplary meter incorporating a multi-layer printed circuit board with a notch antenna in accordance with one embodiment of the present invention.

FIG. 1 is an illustration of an exemplary device 150 employing a printed circuit board 100 containing a notch antenna 106 that employs the ground plane or circuit common element of the printed circuit board 100 that contains electronic radio-frequency (RF) components, such as a RF transceiver. The device 150, as shown in FIG. 1, is an electricity meter, which may be used for measuring the consumption of electricity. The RF circuitry and the notch antenna allow for remote access to meter functions and meter data. As shown, the meter 150 includes multiple printed circuit boards. At least one multi-layer printed circuit board 100 may be mounted to a socket on a base of the meter 150 and may be oriented in a vertical plane. A housing 155 surrounding the meter 150 may be mounted to the base 160 of the meter 150, allowing the printed circuit board 100 to be self-contained within the meter 150. In such an embodiment, where the multi-layer printed circuit board 100 is vertically oriented, the notch antenna 106 may be horizontally oriented on the printed circuit board.

A vertical orientation of the printed circuit board 100 along with the horizontal orientation of the notch antenna 106 allows the notch antenna 106 to achieve vertical radiation polarization. Vertical radiation polarization desirably provides for an omni-directional radio coverage pattern. In typical metering applications, it may be necessary for metering signals to reach towers, relays, and/or other meters. As the location and placement of meters is often constrained due to building orientation and servicing points, an omni-directional, or substantially omni-directional, radio coverage pattern assists in the signals reaching the appropriate destination. Additionally, an omni-directional radiation pattern is further desirable because a metallic socket enclosure, typically utilized in electricity meters such as the meter 150 of FIG. 1, produces a reflection of signals to the rear of the enclosure when the printed circuit board 100 is mounted in the device 150. The reflection of signals may alter the omni-directional radiation pattern, creating a substantially omni-directional radiation pattern. A substantially omni-directional radiation pattern satisfies the need of the metering signals to reach towers, relays, and/or other meters, whereas other radiation patterns that become altered due to the device 150 may not satisfy this requirement.

The incorporation of a conventional antenna in a meter 150 with a vertically oriented printed circuit board 100 traditionally causes difficulties in the operation of the conventional antenna. For example, a vertically polarized monopole, dipole, or loop antenna, located in close proximity to the metallic structure and ground planes of the printed circuit board 100 results in an asymmetric coverage pattern and a low gain. Solutions to these problems have unsuccessfully been attempted. For example, meters with an additional printed circuit board or a separate assembly containing the antenna have been made. However, additional expenses and space requirements arise from this attempted solution with only a slight improvement in the antenna's radiation coverage. Other antenna options, such as employing a traditional monopole antenna on the printed circuit board, require a horizontal orientation of the printed circuit board. Such options are, unfortunately, not practical as the horizontal orientation increases the size of the meter without fully utilizing its space. Yet another attempted option includes the electrical shortening of a traditional monopole or dipole antenna. However, in the frequency bands typically utilized for metering (902-928 MHz) and cellular (850 MHz) operations, the shortened antenna is inefficient.

Figure 2:
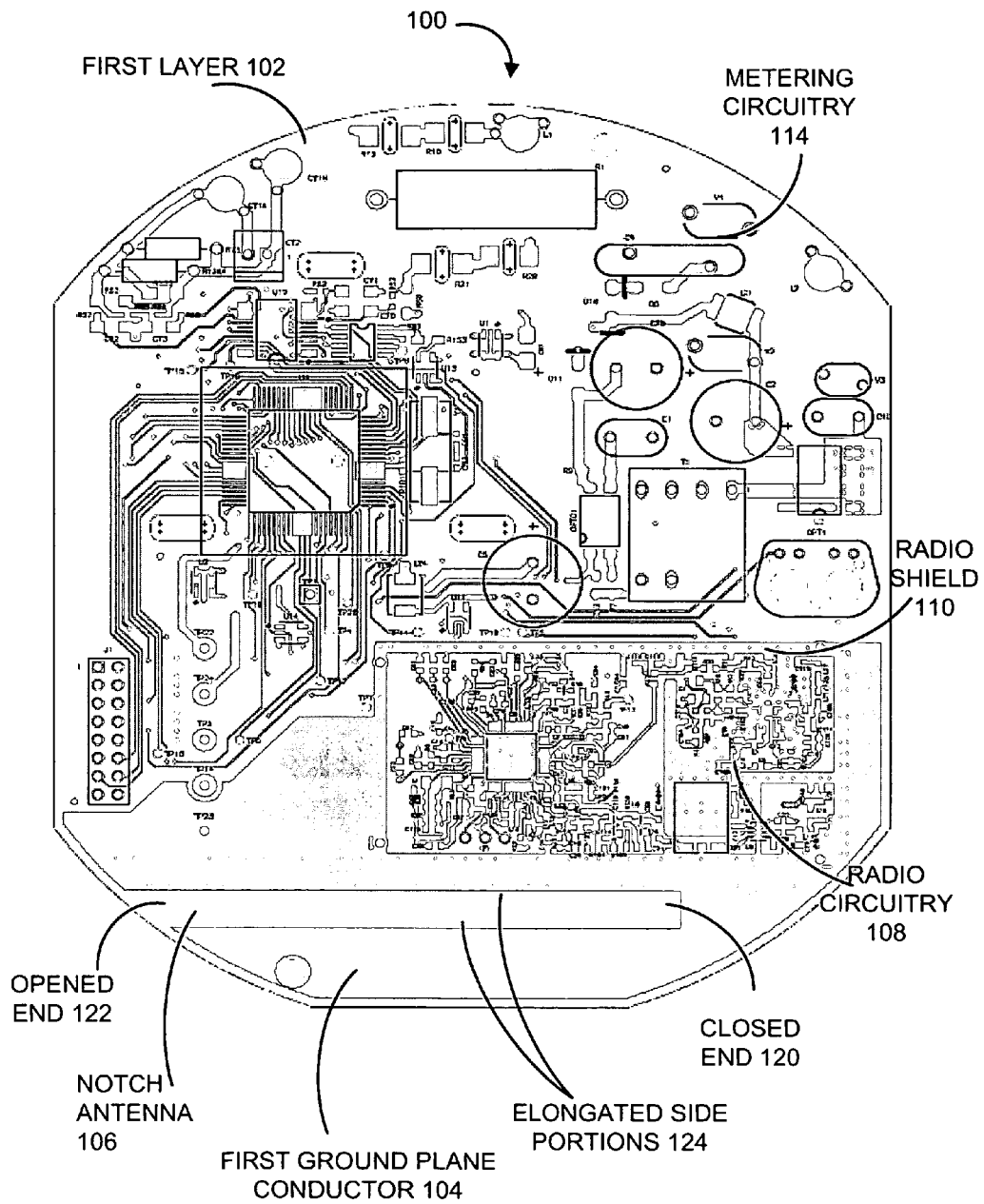
FIG. 2 is a printed circuit board diagram illustrating a first layer of a multi-layer printed circuit board in accordance with one embodiment of the present invention.

The notch antenna 106 is desirable over the above-mentioned options. The implementation of the notch antenna 106 in a ground plane or circuit common of the printed circuit board 100 that includes electronic circuitry (e.g. metering and/or RF circuitry) conserves space on the printed circuit board 100 while also operating efficiently. FIG. 2 is an illustration of a first or top layer 102 of a multi-layer printed circuit board 100, in accordance with an embodiment. A first ground plane conductor 104 is positioned on the first layer 102 of the printed circuit board 100. A notch antenna 106 is formed into the first ground plane conductor 104 of the printed circuit board 100. For example, the notch antenna 106 may be etched or embedded into the first ground plane conductor 104.

The notch antenna 106 includes a closed end 120, an opened end 122, and two elongate side portions 124 between the closed end 120 and the opened end 122. The radiation of the notch antenna 106 is produced by currents that flow around the closed end 120, thus eliminating a need for a dedicated or isolated area of the printed circuit board 100. The opened end 122 of the notch antenna 106 has a high impedance, while the closed end 120 has a low impedance and may substantially be a short circuit. Thus, the notch antenna 106 establishes resonance, while providing an impedance match in order to establish current flow in the ground plane conductor 104 of the first layer 102. Additionally advantageous is that the notch antenna 106, while being oriented horizontally, produces an omni-directional, vertically polarized radiation field.

Components may be positioned adjacent to the edges of the notch antenna 106, a further feature that is not feasible when implementing a printed circuit board 100 with a traditional monopole, dipole, or loop antenna. Radio circuitry 108 may be located on the first layer 102 of the multi-layer printed circuit board 100. The radio circuitry 108 may include, but is not limited to, a wireless radio transmitter, a wireless radio receiver, and/or a wireless radio transceiver. In an exemplary meter application, a radio transceiver may provide for remote access to the meter functions and meter data. A radio shield 110 may surround the radio circuitry 108 and may be in electrical contact with the first ground plane conductor 104.

The radio circuitry 108 and the notch antenna 106 are connected by a transmission line 112. The radio circuitry 108 connection to the notch antenna 106, through the transmission line, allows for the reception and transmission of metering and other signals to and from the radio circuitry 108 through the notch antenna 106.

The printed circuit board 100 may also include metering circuitry 114 for performing various metering functions. The metering circuitry 114 may be located on the first layer 102 of the printed circuit board 100. Other circuitry and connections are shown in FIG. 2.

Figure 3:
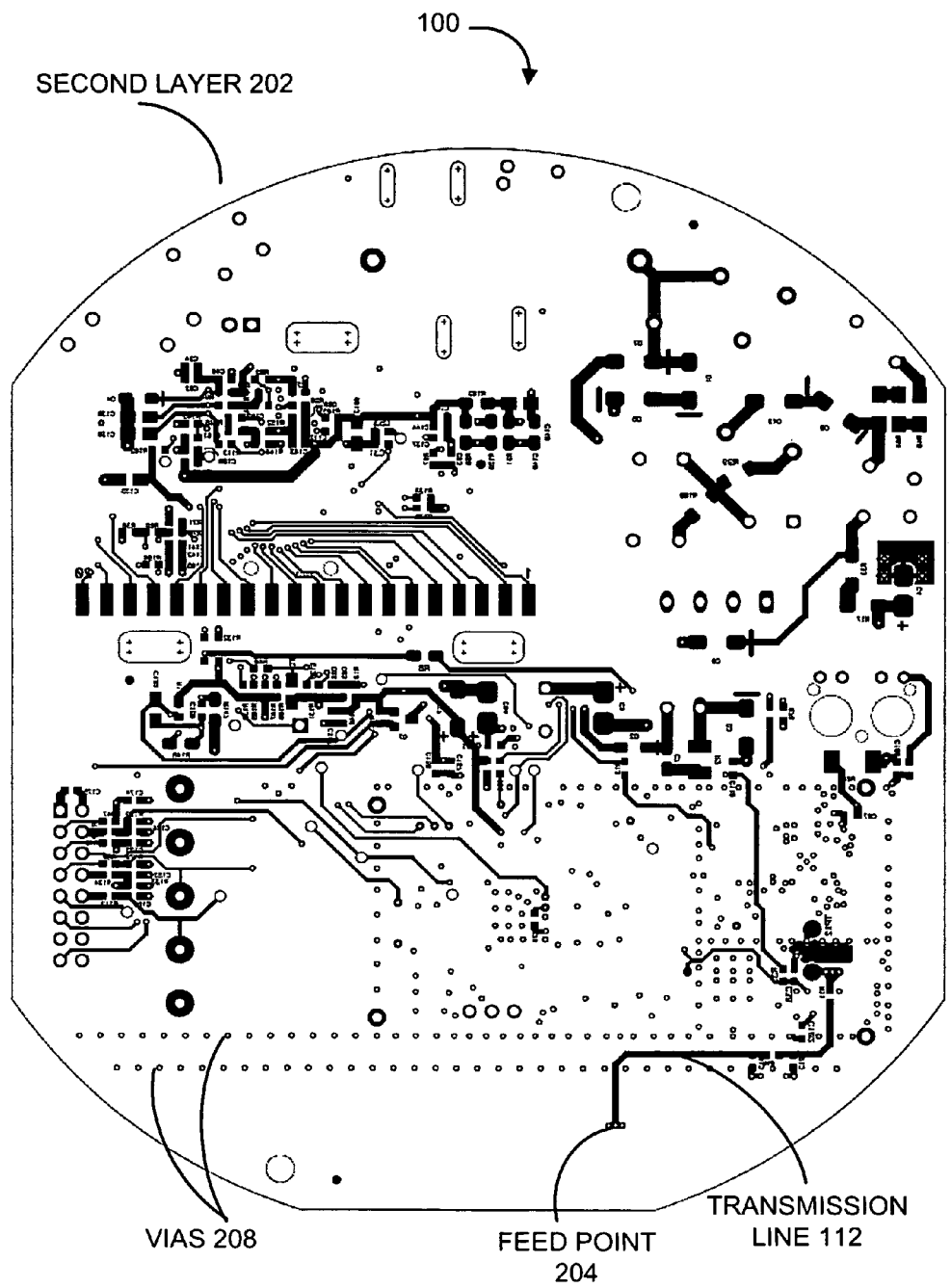
FIG. 3 is a printed circuit board diagram illustrating a second layer of a multi-layer printed circuit board in accordance with one embodiment of the present invention.

FIG. 3 is a depiction of a second or bottom layer 202 of the multi-layer printed circuit board 100, in accordance with an embodiment. The second layer 202 may be positioned beneath the first layer 102. The first layer 102 and the second layer 202 may be electrically connected through plated through-holes or vias 208. In an embodiment, the bottom layer 202 includes a buried ground plane conductor 206, which may enclose the radio shield 110 surrounding the radio circuitry 108. The buried ground plane conductor 206 may shield and decouple the radio circuitry 108 on the first layer 102 from external electrical fields, such as antenna radiation fields. The buried ground plane conductor 206 may be a copper layer. In an embodiment, the buried ground plane conductor 206 may not extend to cover the portion of the printed circuit board 100 containing the notch antenna 106. In an embodiment where the buried ground plane conductor 206 extends down to a lower edge of the notch antenna 106, a buried power and ground plane are simulated. Additionally, due to its closeness to printed circuit conductors on the first layer 102 of the printed circuit board 100, the buried ground plane conductor 206 may shield and decouple the printed circuit conductors from unwanted cross-talk produced by nearby conductors. The shielding and decoupling result from a common ground plane. As a return current path maintains a signal propagation in the printed circuit conductors, transverse electromagnetic waves propagate in the space between the conductors and the ground plane 206 with no overlapping fields to couple to nearby conductors.

The printed circuit board 100 includes a transmission line 112 for transferring power to and from the radio circuitry 108 and the notch antenna 106. The transmission line 112 may pass through the printed circuit board 100 from the second layer 202 to the first layer 102 through one or more vias 208. The transmission line 112 may include a printed circuit transmission line positioned on the second layer 202 of the printed circuit board 100 and may cross under the portion of the printed circuit board 100 containing the notch antenna 106, as shown in FIG. 3. In an embodiment, the transmission line 112 may vertically cross under the portion of the printed circuit board 100 containing the notch antenna 106. In another embodiment, the transmission line 112 may cross under the portion of the printed circuit board 100 containing the notch antenna 106 so that the transmission line is perpendicular to a longitudinal axis of the notch antenna 106.

The transmission line 112 may connect to one of the two elongate side portions 124 of the notch antenna 106. The connection of the transmission line 112 to one of the two elongate side portions 124 of the notch antenna 106 may be through a feed point 204. The feed point 204 may be located along a portion of one of the two elongate side portions 124 of the notch antenna 106. The feed point 204 preferably provides an impedance match for an impedance of the transmission line 112 since the opened end of the notch antenna 106 is a high impedance point, approaching infinity on lossless substrates, and the closed end of the notch antenna 106 is a low impedance point, approaching zero. In an exemplary embodiment, the feed point 204 may be placed nearer to the closed end 120 of the notch antenna 106 in order to match a 50-ohm transmission line 112. Other placements of the feed point 204 may be utilized in order to obtain a desired impedance match of the transmission line 112.

Figure 4A:
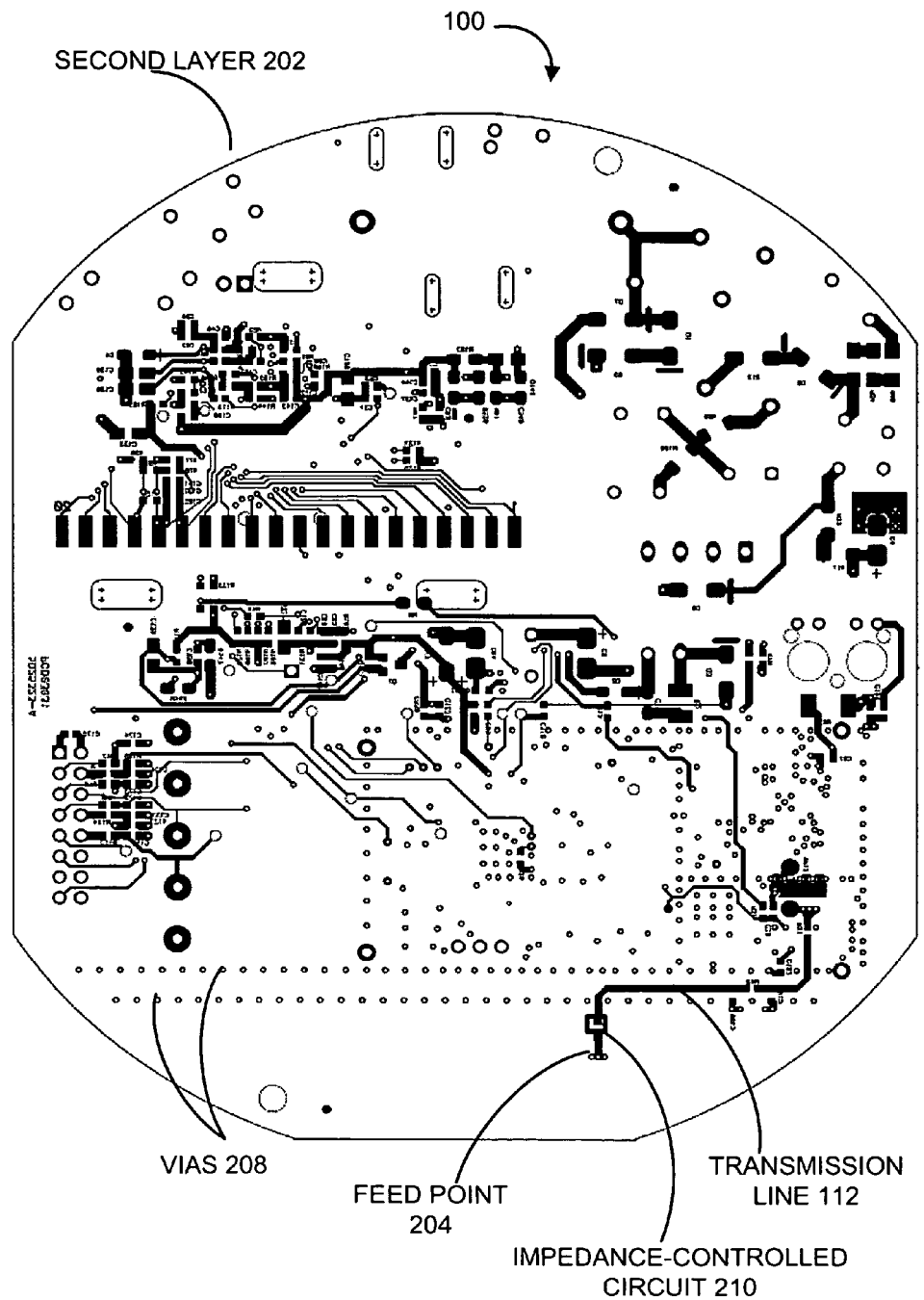
FIG. 4A is a printed circuit board diagram illustrating a layer of a multi-layer printed circuit board in accordance with another embodiment of the present invention.

FIG. 4A is an illustration of a second or bottom layer 202 of the multi-layer printed circuit board 100, in accordance with another embodiment. In the embodiment shown in FIG. 4A, the transmission line 112 includes an impedance-controlled transmission line having, for example, an impedance-controlled circuit 210 inserted into the transmission line 112. Preferably, the impedance-controlled transmission line maintains an impedance match at the radio port and at the notch antenna feed point. The impedance-controlled circuit 210 may include a capacitive circuitry element 210 in, for example, the portion of the transmission line 112 that crosses under the portion of the multi-layer printed circuit board 100 containing the notch antenna 106. As shown, the capacitive circuitry element 210 may be positioned in series with the transmission line 112 across the notch antenna 106 and near the closed end 120 of the notch antenna 106. The capacitive circuitry element 210 helps tune out the series inductance of the transmission line 112. This capacitive circuitry element 210 may be positioned directly under the notch antenna 106 and may be connected with vias 208.

The impedance-controlled circuit 210 may also include an inductive circuitry element 210 in series with the portion of the transmission line 112 that crosses under the portion of the printed circuit board 100 that contains the notch antenna 106. Alternately, in an embodiment, the impedance-controlled circuit 210 includes the inductive circuitry element 210 but not the capacitive circuitry element 210.

Figure 4B:
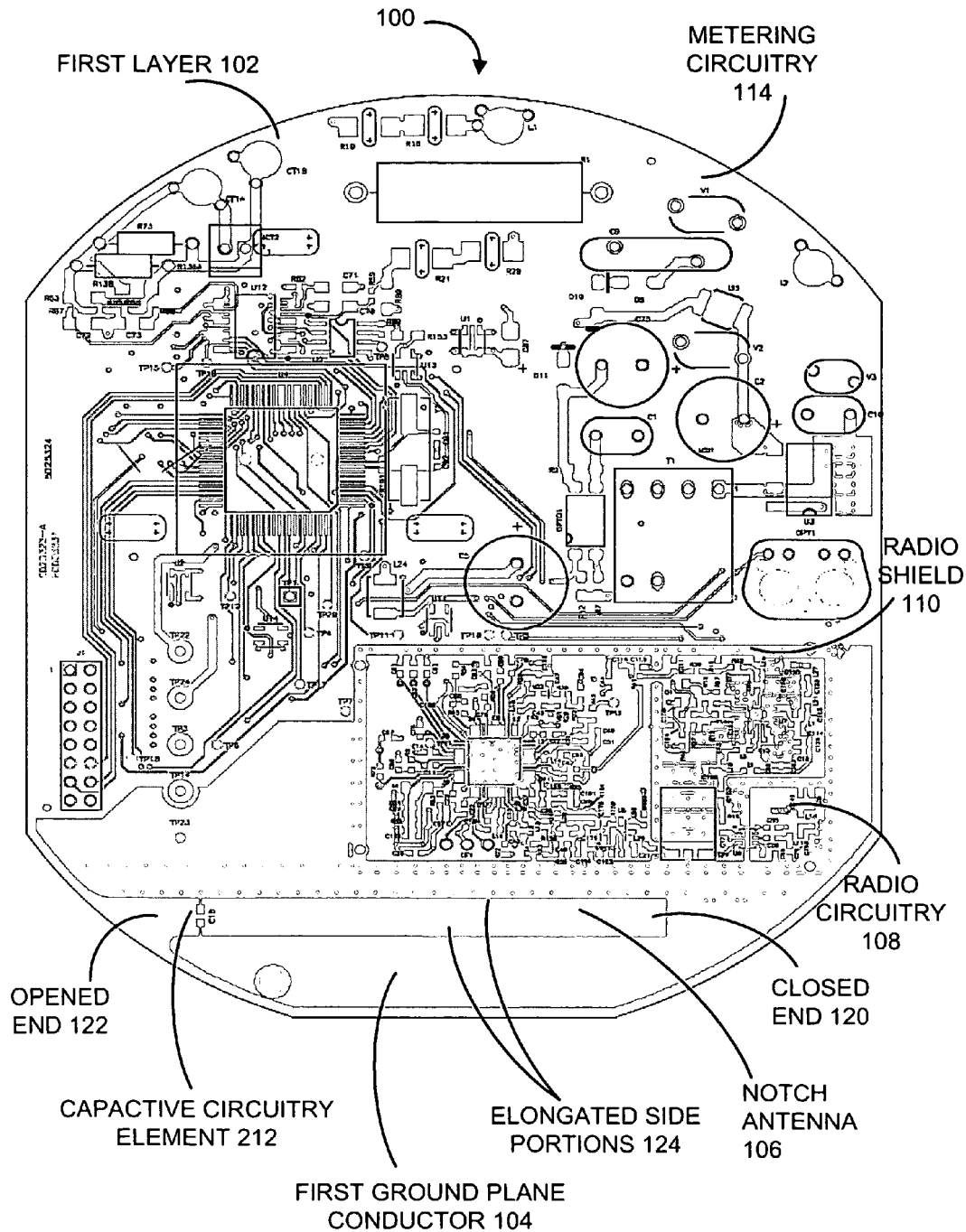
FIG. 4B is a printed circuit board diagram illustrating a first layer of a multi-layer printed circuit board in accordance with another embodiment of the present invention.

FIG. 4B is an illustration of a first or top layer 102 of the multi-layer printed circuit board 100, in accordance with another embodiment. In the embodiment shown in FIG. 4B, an additional capacitive circuitry element, capacitive circuitry element 212, may be positioned near the opened end 122 of the notch antenna 106 and directly across the notch antenna 106. The capacitive circuitry element 212 may be placed directly under the notch antenna 106. The capacitive circuitry element 212 operates to tune the notch antenna 106 to a lower operating frequency. In an embodiment, both the impedance-controlled circuit 210 and the capacitive circuitry element 212 may each be incorporated.

Figure 5A:
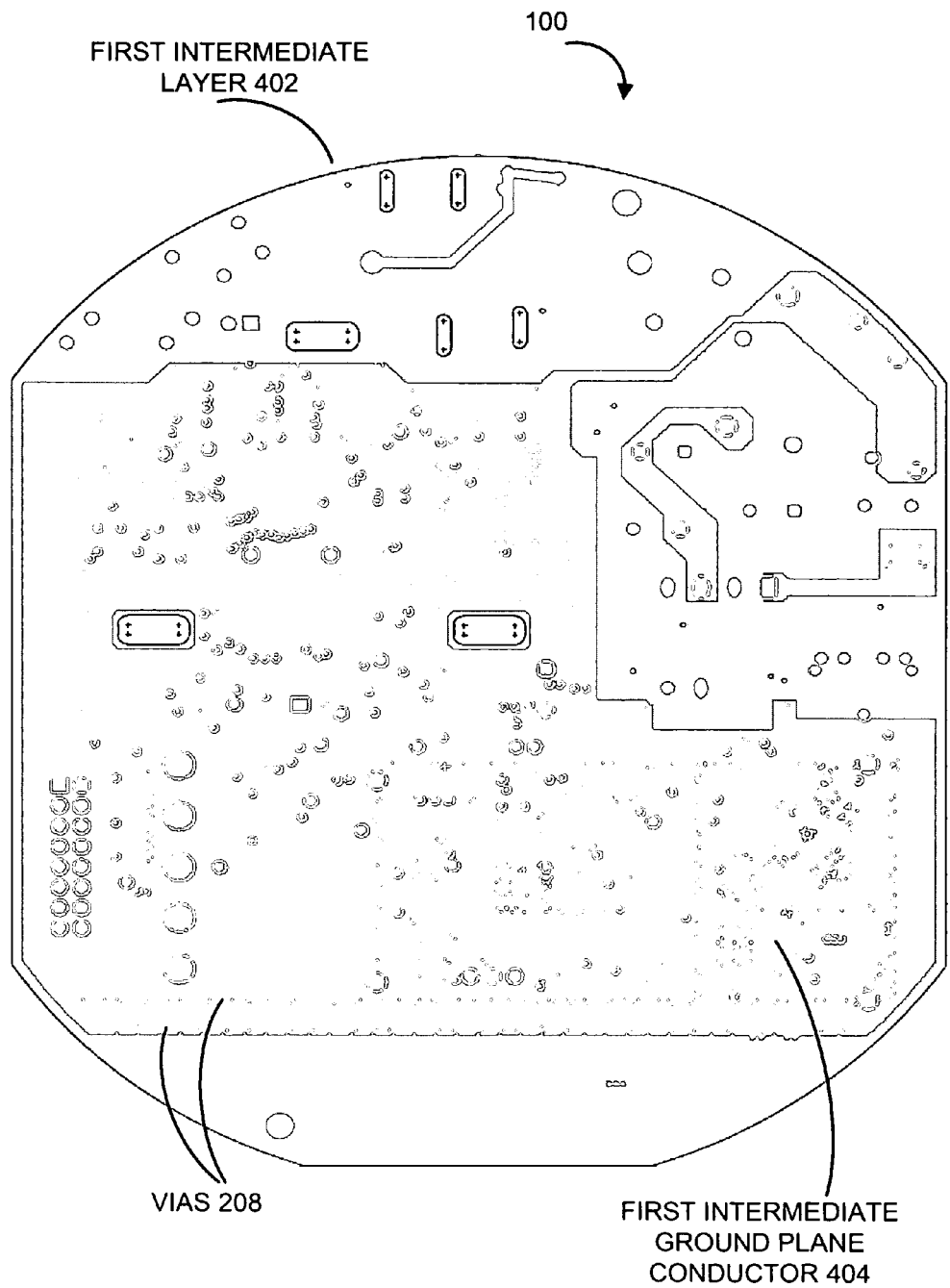
FIGS. 5A and 5B are printed circuit board diagrams respectively illustrating a first and second intermediate layer of a multi-layer printed circuit board in accordance with embodiments of the present invention.

FIG. 5A is an illustration of an additional embodiment, in which a first intermediate layer 402 may be positioned between the first layer 102 and the second layer 202 of the multi-layer printed circuit board 100 containing the notch antenna 106. The first intermediate layer 402 may include a ground plane conductor, herein a first intermediate ground plane conductor 404, which may be a buried tertiary ground plane conductor. The first intermediate ground plane conductor 404 may provide a grounded return path for the transmission line 112 and may be electrically coupled to the first layer 102 and the second layer 202 through vias 208.

Due to its close proximity to the bottom surface of the printed circuit board 100, the first intermediate ground plane conductor 404 enables the transmission line 112 to advantageously be constructed in a narrow width line. If the intermediate layer 402 and its corresponding ground plane conductor 404 are not incorporated in the printed circuit board 100, a larger width line is required due to the larger dielectric thickness between the transmission line 112 and the ground plane 206. In an example embodiment, the dielectric thickness between the first intermediate layer 402 and the second layer 202 is 0.014 inches, allowing a 50-ohm transmission line 112 to be formed with a width of 0.025 inches. This compares to 0.046 inches between the first layer 102 and the second layer 202 for a printed circuit board 100 without a first intermediate ground plane conductor 404, requiring a 0.10 inch width for the transmission line 112. Thus, the incorporation of the first intermediate ground plane conductor 404 greatly reduces the width required for the transmission line 112.

Figure 5B:
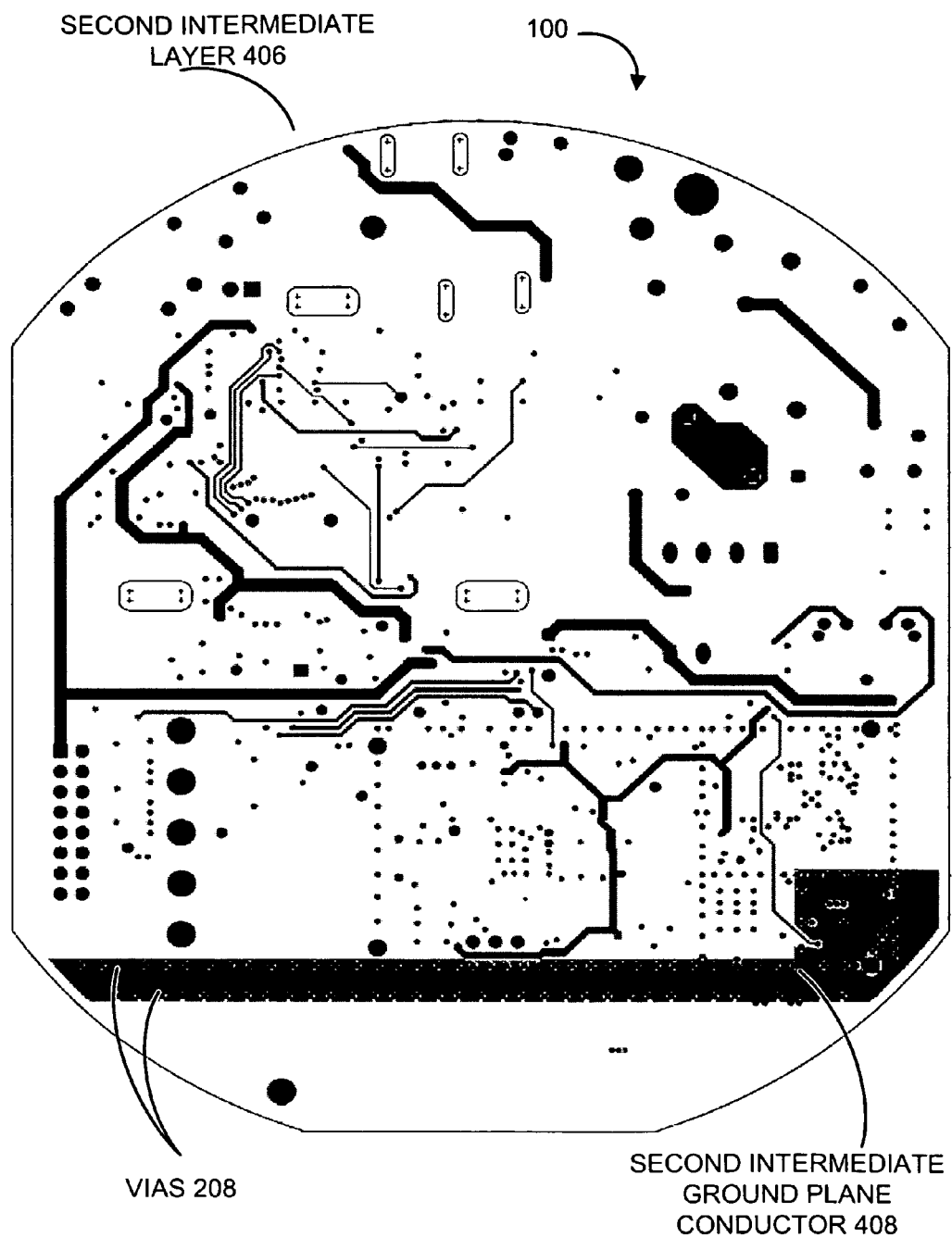

In another embodiment, as shown in FIG. 5B, a second intermediate layer 406 may be positioned between the first intermediate layer 402 and the second layer 202 and may include a ground plane conductor, herein a second intermediate ground plane conductor 408. The second intermediate ground plane conductor 408 may be electrically coupled between the first intermediate layer 402 and the second layer 202 by vias 208.

The two elongate side portions 124 of the notch antenna 106 may be parallel to and opposite each other, as shown in FIG. 2. Alternatively, in another embodiment shown in FIG. 5D, the opened end 122' of the notch antenna 106' may be flared from the closed end 120' to the opened end 122' of the notch antenna 106'. The flared portion of the notch antenna 106' may or may not be symmetrically flared. Additionally in another embodiment as shown in FIG. 4B, the opened end 122 of the notch antenna 106 may be rounded. A rounded opened end of the notch antenna 106 broadens the frequency bandwidth of the notch antenna 106; thus the opened end 122 may be accordingly formed in order to obtain a desired frequency bandwidth. The rounded opened end portion of the notch antenna 106 may be, but is not required to be, symmetrical. In an embodiment, the notch antenna 106 is an electrical quarter wavelength in length. Embodiments having one or more, or different combinations, of these features are contemplated.

Figure 5C:
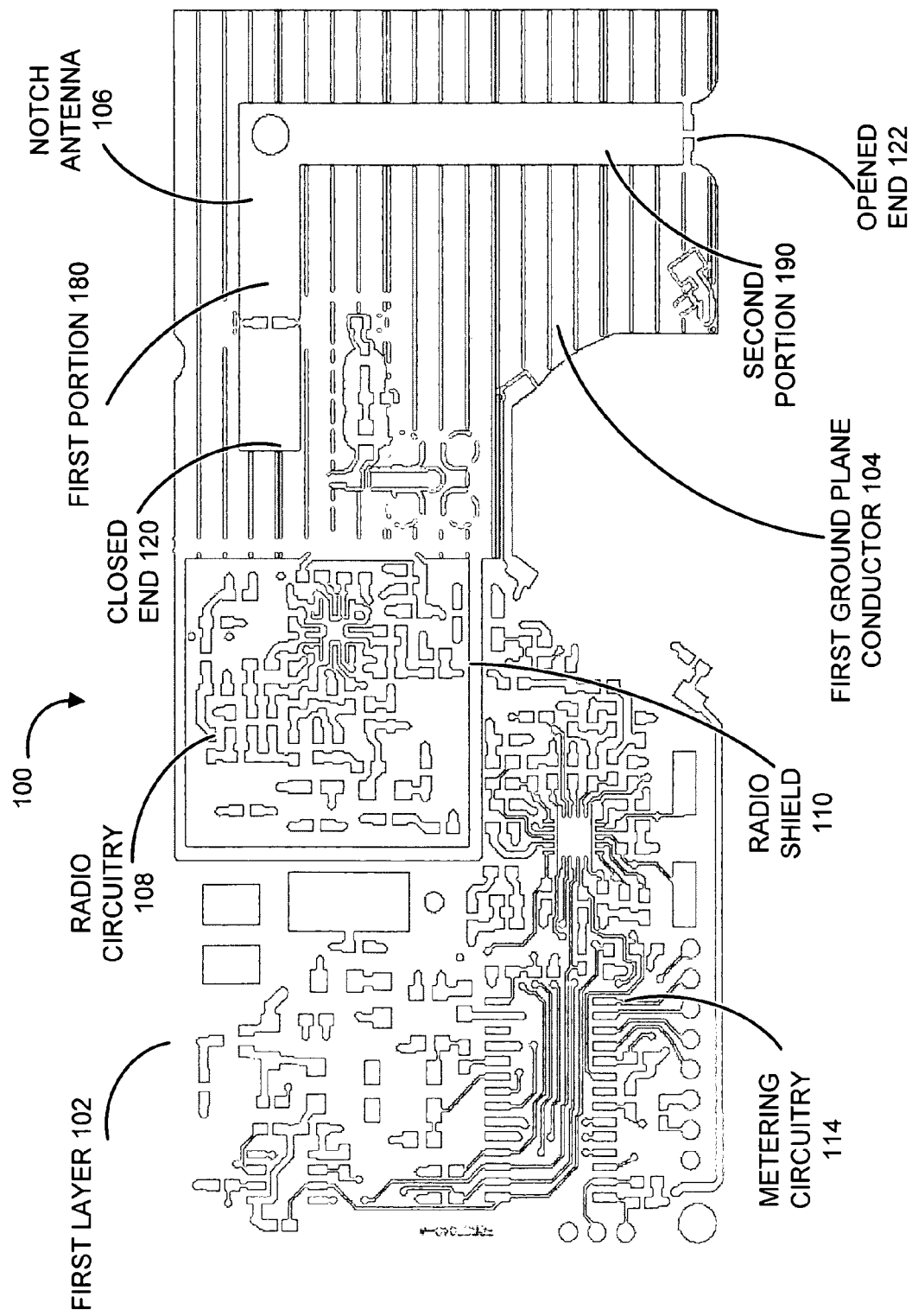
FIG. 5C is a printed circuit board diagram illustrating a first layer of a multi-layer printed circuit board in accordance with yet another embodiment of the present invention.
Figure 5D:
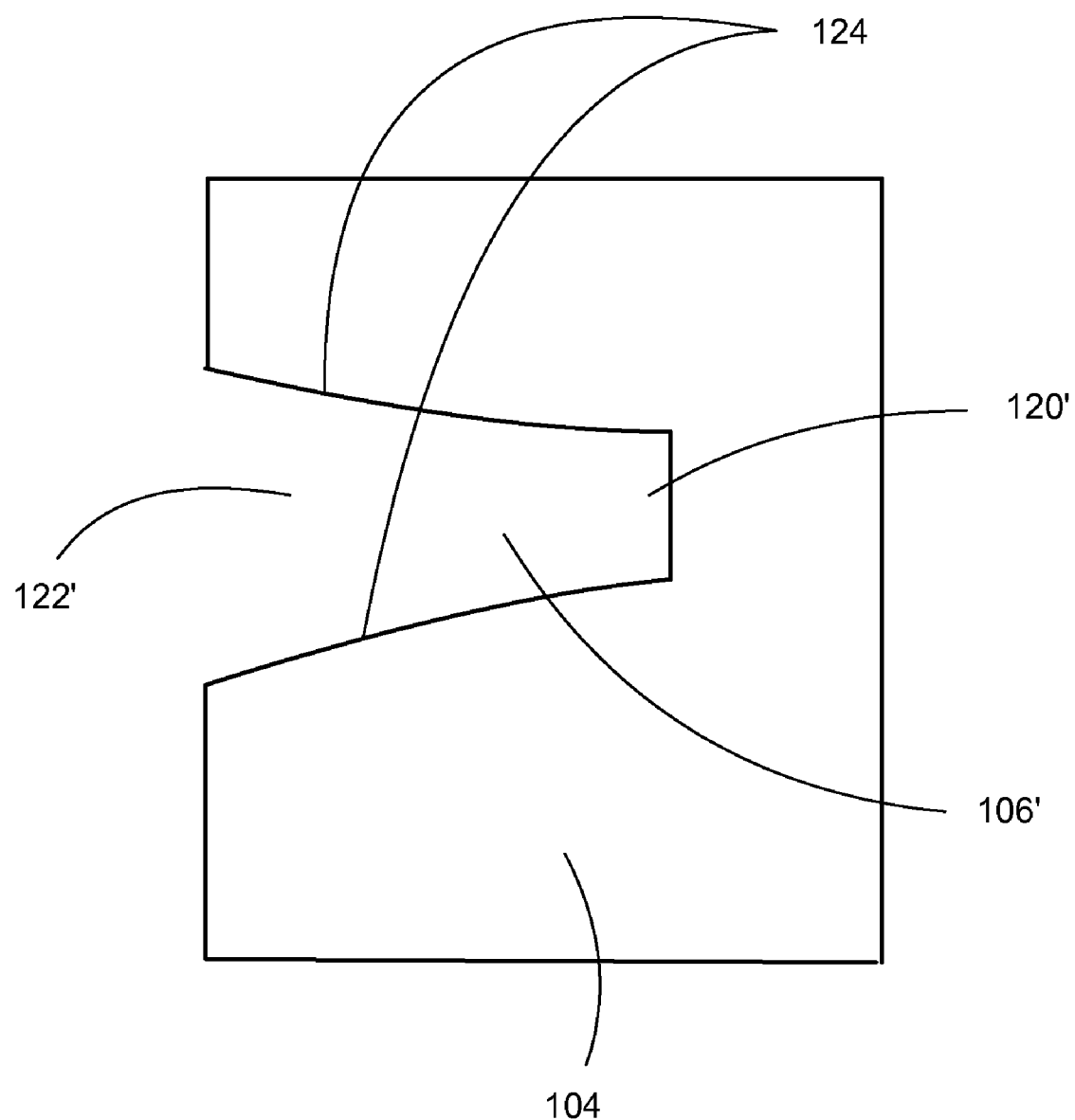
FIG. 5D is a diagram illustrating an alternative embodiment of a printed circuit notch antenna.

In yet another embodiment, as shown in FIG. 5C, the notch antenna 106, formed into the first ground plane conductor 104 of the printed circuit board 100, may be configured in a bent or "L" shape having a first portion 180 and a second portion 190. The bent or "L" shape may be configured to allow for a 90-degree angle between the first portion 180 and the second portion 190. Other angles between the two portions 180 and 190 are also contemplated. A portion of the notch antenna 106 that terminates in the closed end 120 of the notch antenna 106, for example, the first portion 180 as shown in FIG. 5C, may be oriented horizontally on the printed circuit board 100. The horizontal orientation of the portion of the notch antenna 106 that terminates in the closed end 120 achieves vertical radiation polarization. Additionally, as illustrated in FIG. 5C, the printed circuit board 100 may be formed in a rectangular shape. Other shapes for the printed circuit board 100 are contemplated, and the embodiments described herein are not limited to circular or rectangular configurations.

Figure 6:
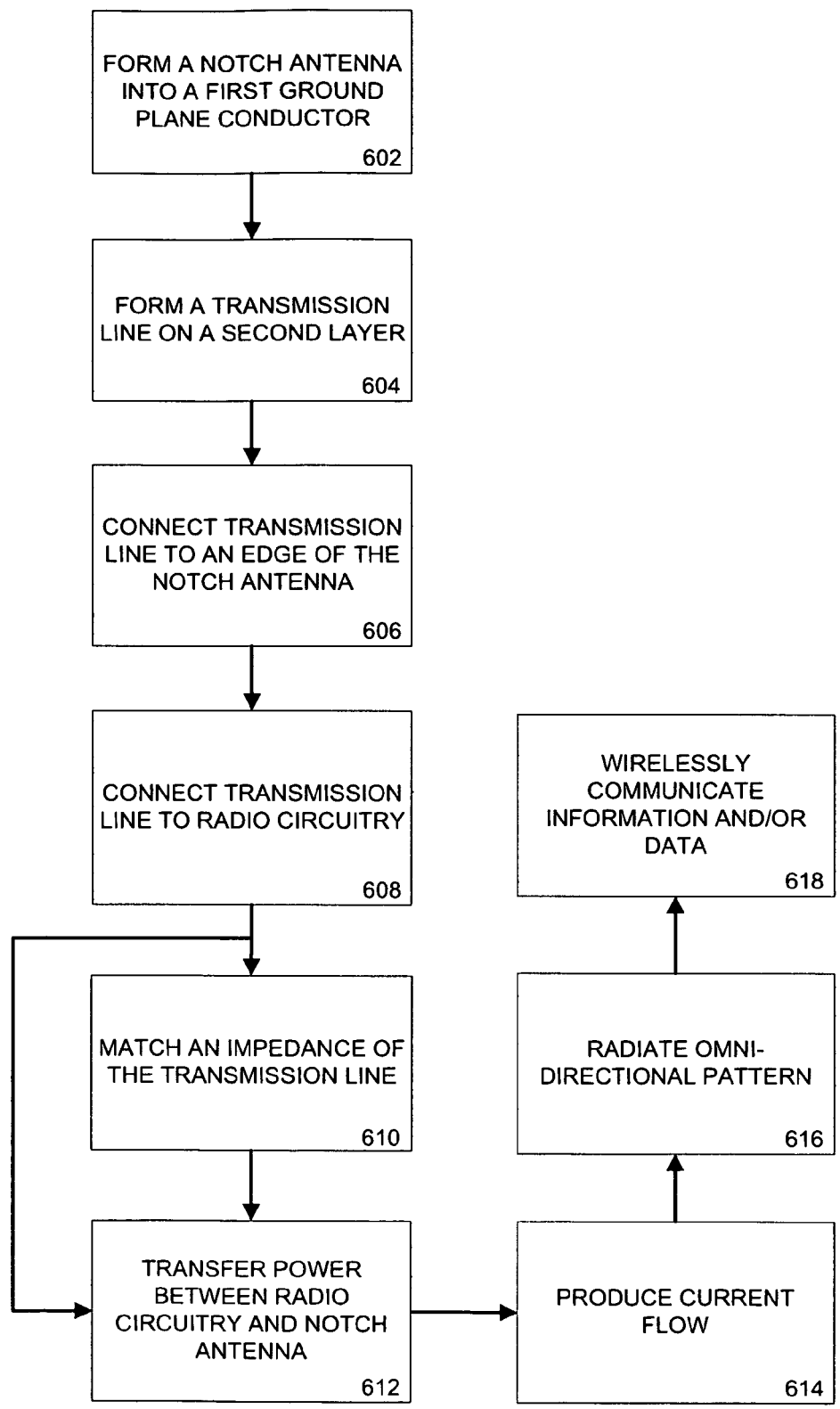
FIG. 6 is a flow diagram illustrating one embodiment of a method of forming anomni-directional radiation pattern for transmission from a metering device.

FIG. 6 is a flow diagram illustrating a method of forming an omni-directional radiation pattern for transmitting from a wireless device, such as a meter 150, in accordance with an embodiment of the present invention. Referring to FIG. 6, at 602 a notch antenna 106 is formed in a ground plane 104 of a first layer 102 of a printed circuit board. For example, the notch antenna 106 may be etched or embedded into the ground plane conductor 104 of the first layer 102. The etching of the notch antenna 106 may include etching the notch antenna 106 so that the notch antenna 106 has a closed end 120, an opened end 122, and two elongate side portions 124 between the closed end 120 and the opened end 122. Further features and configurations of the notch antenna 106 are described in more detail above.

The notch antenna 106 is connected to radio circuitry 108 through a transmission line 112. This connection may be made by, starting at 604, forming the transmission line 112 as a printed circuit transmission line on a second layer 202 of the printed circuit board 100. The transmission line 112 may extend vertically under a portion of the printed circuit board 100 that contains the notch antenna 106. At 606, one or more vias 208 extend through the printed circuit board 100, between the first layer 102 and the second layer 202, and connect the transmission line 112 to an edge of the notch antenna 106. At 608, the transmission line 112 is connected to the radio circuitry 108. The connection between the transmission line 112 and the radio circuitry 108 may be facilitated through vias 208.

At optional step 610, following the process of forming the connection between the transmission line 112 and the radio circuitry 108, an impedance matching, by for example inserting an impedance-controlled circuit in series with the transmission line 112, may be performed.

At 612, power is transferred to and from the radio circuitry 108 and the notch antenna 106 through the transmission line 112. At 614, RF current flows from the transmission line 112 to the notch antenna 106, around the closed end 120 of the notch antenna 106, and back to a circuit common of the radio circuitry 108. At 616, a substantially omni-directional radiation pattern, produced by the current flow, is radiated. Information and/or data may be wirelessly communicated to and from the printed circuit board 100, at 618.

Figure 7:
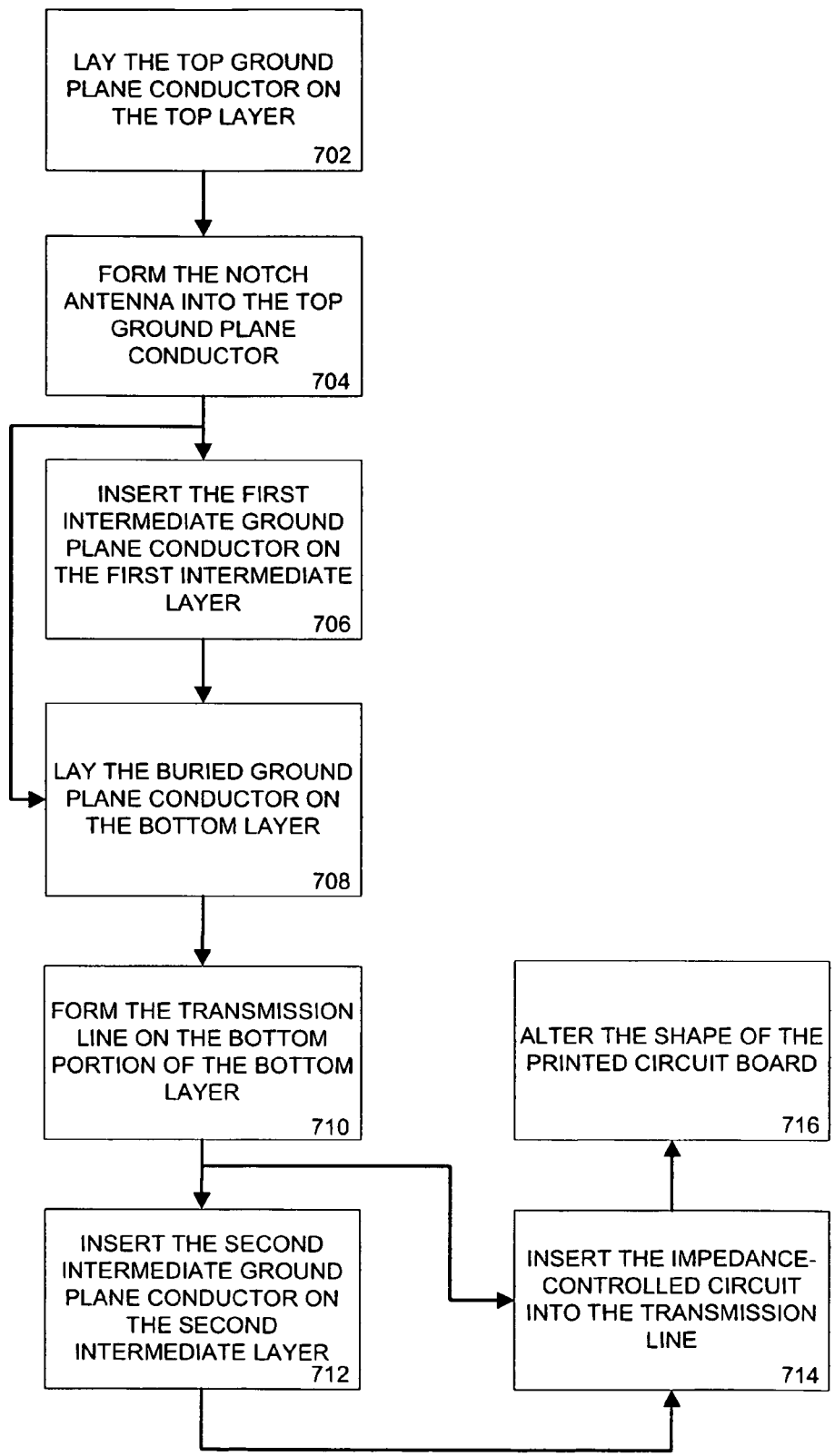
FIG. 7 is a flow diagram illustrating one embodiment of a method of forming a multi-layer printed circuit board having a printed circuit notch antenna.

FIG. 7 is a flow diagram illustrating a method of forming a multi-layer printed circuit board 100 in accordance with an embodiment of the present invention. Referring to FIG. 7, at 702 the first ground plane conductor 104 is laid down on the first layer 102. At 704, the notch antenna 106 may be formed in the first ground plane conductor 104. The notch antenna 106 may, for example, be etched or embedded into the first ground plane conductor 104. The notch antenna 106 may be formed having a closed end 120, an opened end 122, and two elongate side portions 124 between the closed end 120 and the opened end 122. The opened end 122 of the notch antenna 106 may be flared. The method may progress from 704 to 706 or to 708. At 706, a first intermediate ground plane conductor is formed on a first intermediate layer beneath the first layer 102. At 708, the buried ground plane conductor may be laid down on the second layer 202. At 710, the transmission line 112 may be formed on the second layer 202 so that the transmission line 112 crosses under the portion of the printed circuit board 100 containing the notch antenna 106, passes through the printed circuit board 100 through one or more vias 208, and connects to one of the two elongate side portions 124 of the notch antenna 106. Proceeding from 710 to 712, a second intermediate ground plane conductor may optionally be inserted on a second intermediate layer. Proceeding to 714 from 710 or from 712, the impedance-controlled circuit may optionally be inserted into the transmission line 112. The impedance-controlled transmission line may include a capacitive circuitry element and/or an inductive circuitry element, as described above. Optionally, at 716, the shape of the multi-layer printed circuit board 100 may be altered. Certain alterations of the board 100 may be desirable as they may provide manufacturing benefits. For example, if the printed circuit board 100 is circular in shape, cutting off or trimming one or more edges of the board 100, so that one or more of the cut or trimmed edges are straight instead of rounded, may allow for a larger volume of boards to be produced by conserving space.

EXAMPLES

Various tests were conducted in order to obtain information on the operation and characteristics of an exemplary printed circuit board implementation of a notch antenna 106. The tested notch antenna 106 was a quarter wavelength in length and etched into the ground plane of a printed circuit board to simulate a meter printed circuit board, which included a printed transmission line 112 having a 50-ohm impedance to match the output impedance of a test radio. The exemplary notch antenna 106 was tested for operational purposes, the feed-point impedance was measured, and the radiation characteristics of the notch antenna 106 were examined.

Figure 8:
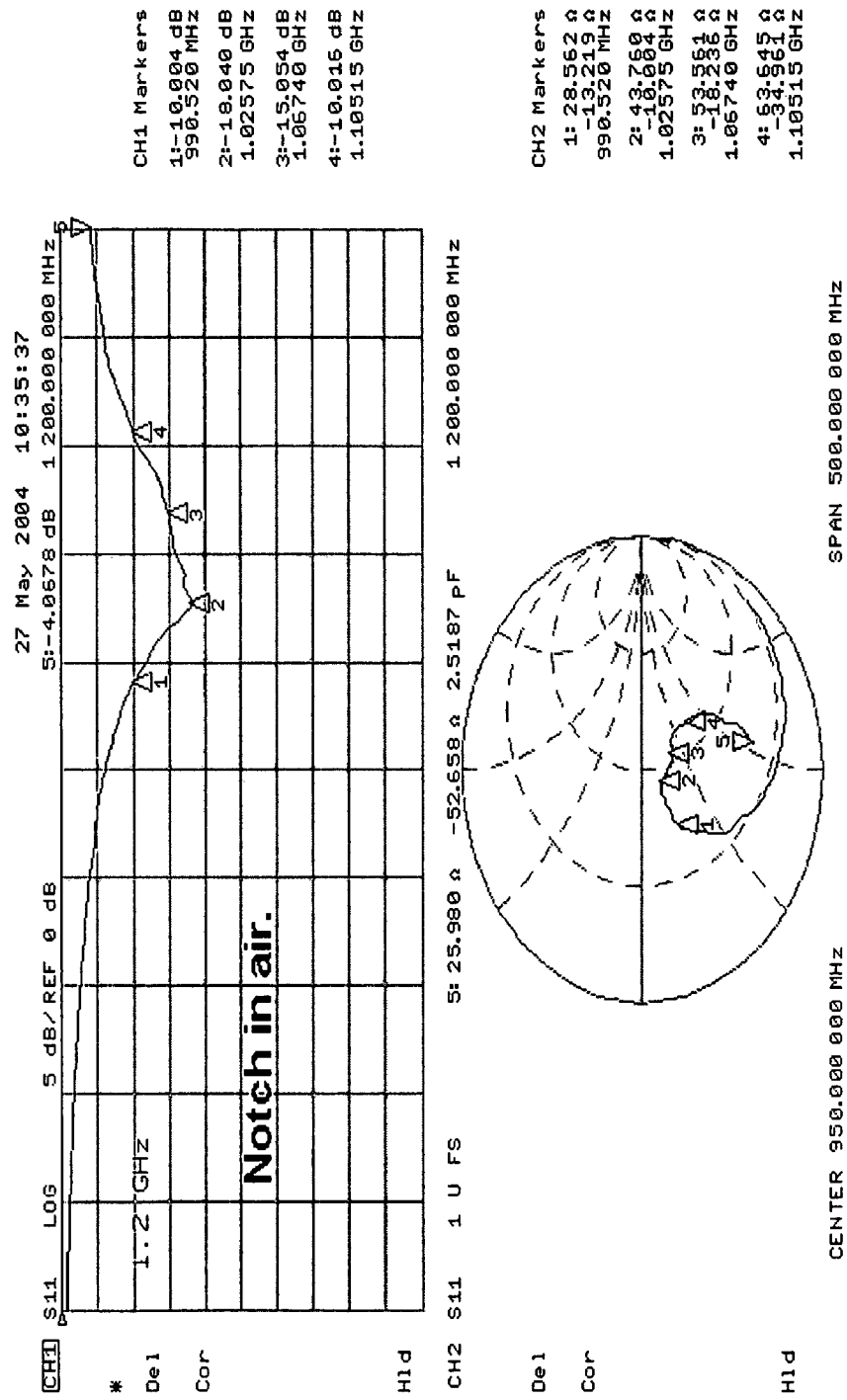
FIGS. 8-12 illustrate various test results incorporating a printed circuit board notch antenna in accordance with embodiments of the present invention.

In a first test, a feed-point impedance of the notch antenna 106 was measured, and a driving-point return-loss was determined as the printed circuit board notch antenna 106 was enclosed in a meter enclosure. The driving-point return-loss is a measure of feed point impedance for the exemplary notch antenna 106. The test results are as shown in FIG. 8. An impedance bandwidth of 200 MHz was measured for the prototype of FIG. 2 in air. At 964 MHz, the peak gain was favorably high at 3.7 dBi, while at 908.5 MHz, the peak gain was 2.5 dBi.

Figure 9:
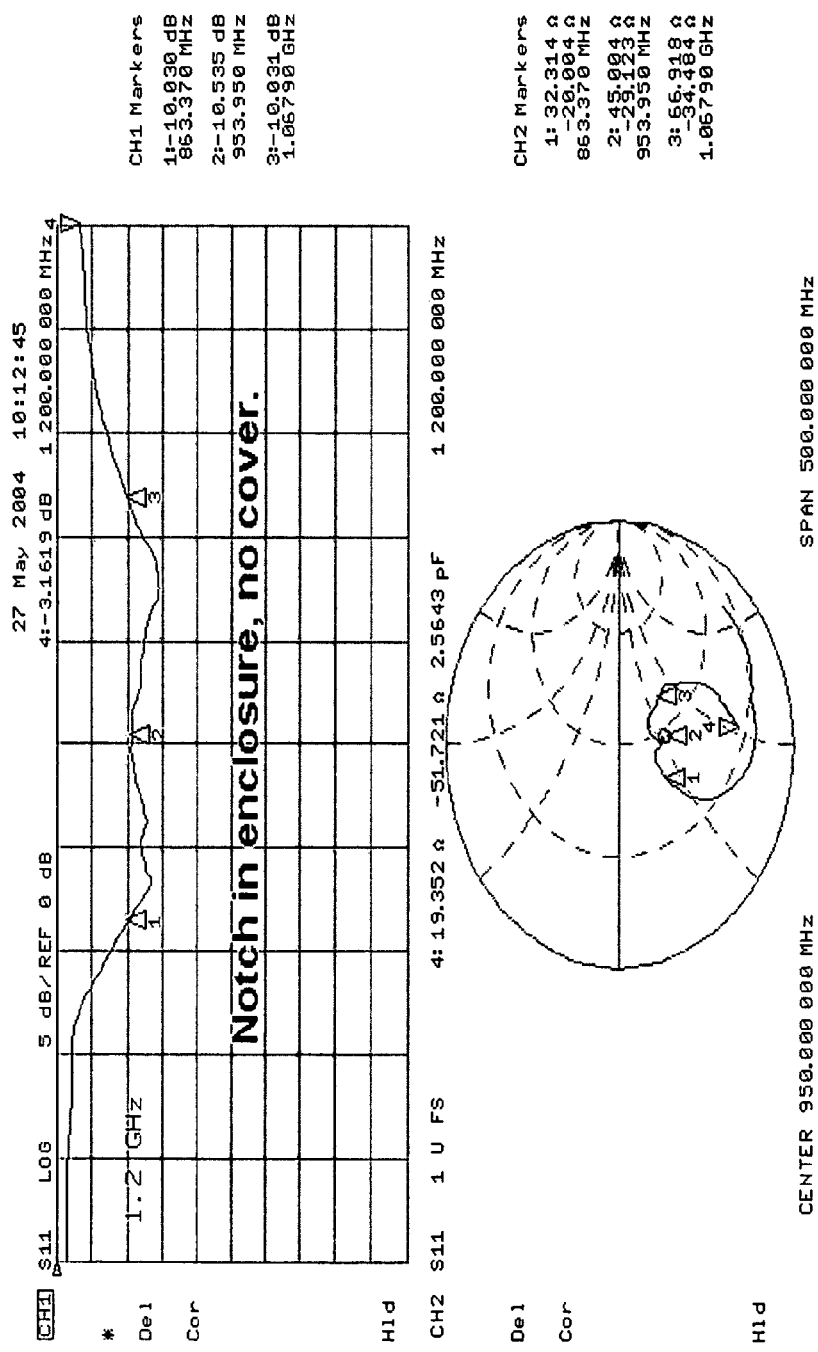
Figure 10:
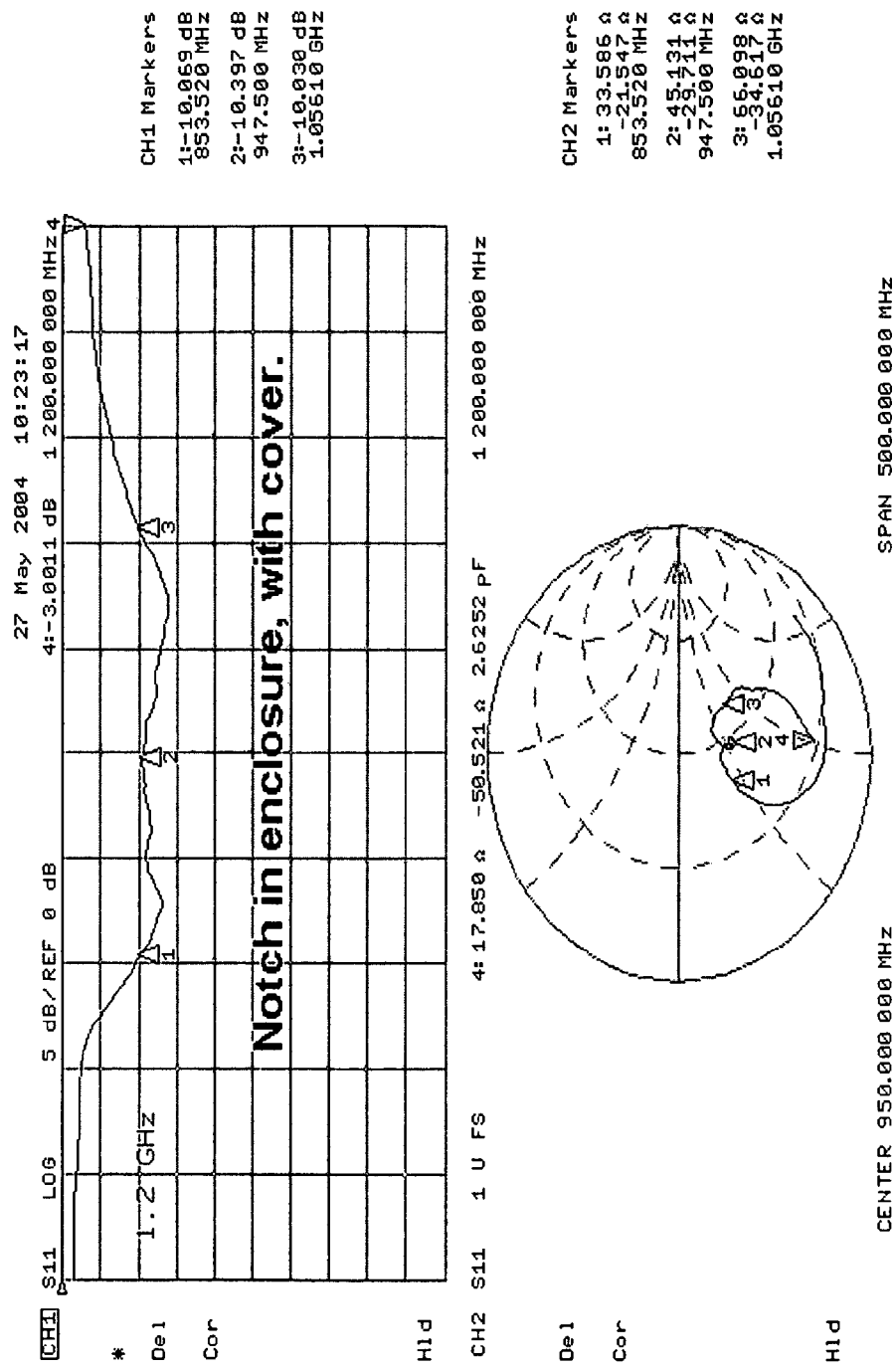

Second test results, where the notch antenna 106 was mounted on a metal meter-socket enclosure without a plastic meter cover, are shown in FIG. 9. Results with the plastic meter cover are illustrated in FIG. 10. A feed-point return loss is shown for both scenarios. The loading effects of the meter-socket enclosure advantageously lowers and broadens the frequency range over which a suitable impedance match is obtained. This is an advantage of the notch antenna 106 compared to traditional printed, monopole, and dipole antennas, which do not have as broad a bandwidth over which a good impedance match may be obtained as compared to the printed circuit notch antenna 106. Furthermore, the broad bandwidth of the notch antenna 106 causes the notch antenna 106 to be less susceptible to de-tuning than the traditional printed, monopole, and dipole antennas. De-tuning may be caused by adjacent electrical components on the printed circuit board 100, such as the radio circuitry 108. The broad bandwidth of the notch antenna 106 additionally enables the notch antenna 106 to accommodate to various frequency bands and their applications. For example, with a broad bandwidth, the notch antenna 106 may be used for cellular applications at 800 MHz as well as ISM applications at 960 MHz without any adjustment.

Figure 11:
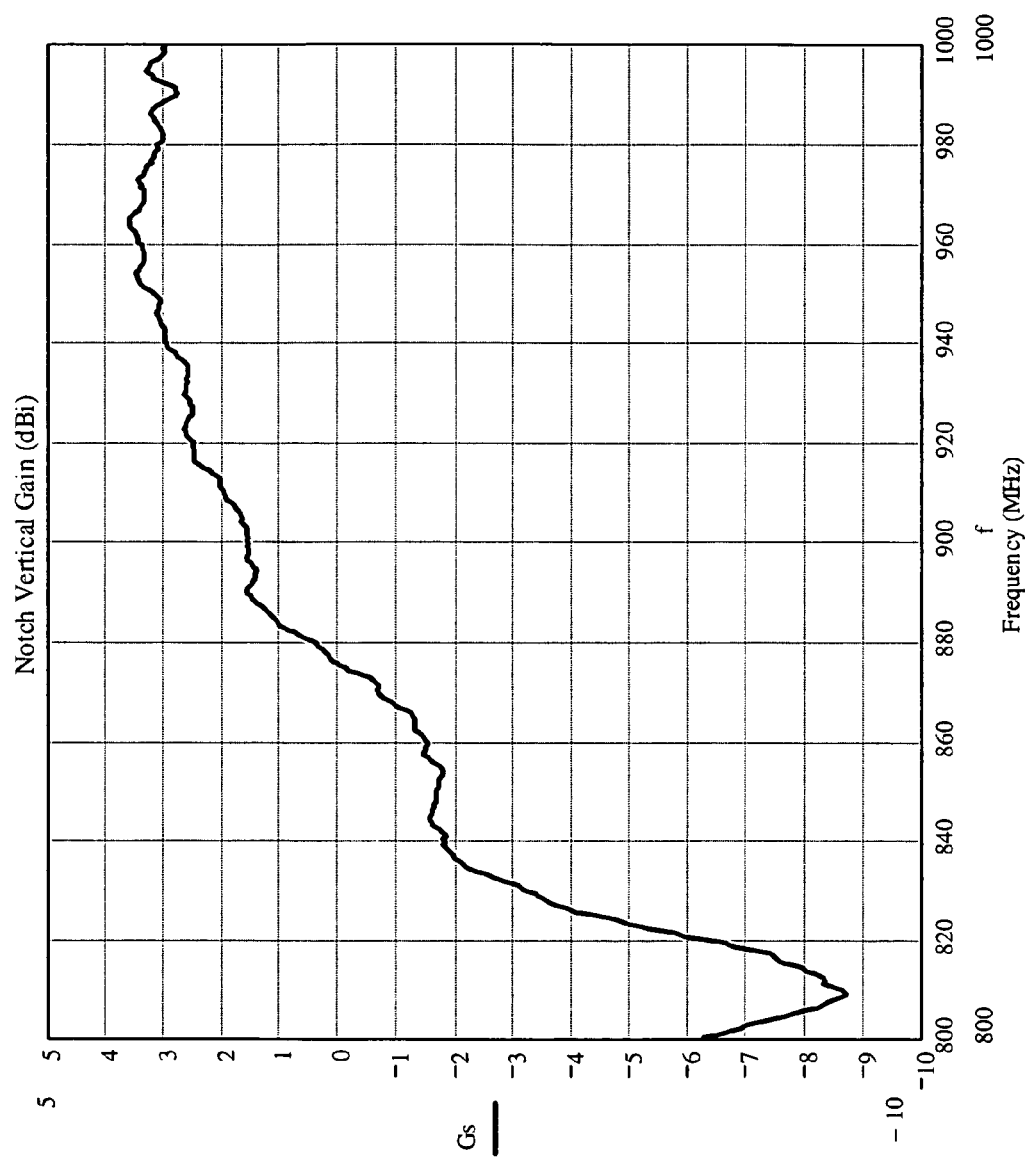

FIG. 11 is an illustration of the vertically polarized radiation gain versus frequency of the notch antenna 106 oriented in a horizontal manner.

Figure 12:
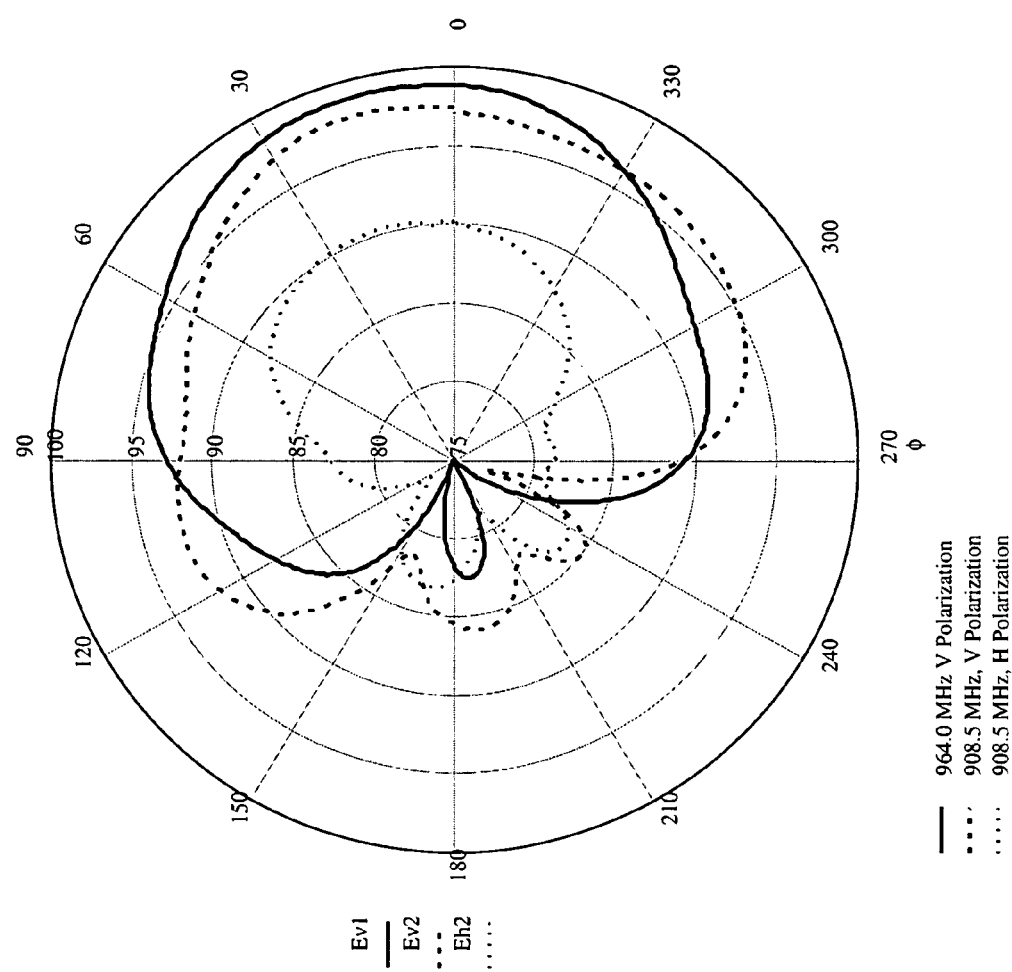

Horizontal and vertical radiation patterns from the notch antenna 106 are shown in FIG. 12. The notch antenna 106, for this test, was mounted in a metallic meter-socket enclosure. The front of the meter is at 0 degrees. The horizontal radiation field is approximately 10 dB lower than the vertical radiation field, indicating a vertically polarized radiation field being produced by the notch antenna 106. Due to the reflection of the radiation from the metallic meter-socket enclosure towards the rear of the meter (at 180 degrees), the shown radiation pattern is towards the right. Although the vertically polarized radiation is omni-directional, the reflection from the meter socket enclosure redirects the radiation pattern to the front-half of the meter, centered around zero degrees azimuth.

The exemplary meter 150 is just one device that may employ the printed circuit notch antenna 106, and the present invention is not limited to electrical metering applications. Rather it is envisioned that the notch antenna 106 may be utilized in, for example, other metering devices, wireless communication devices, and the like. The multi-layer printed circuit board 100 may be part of a meter 150 that measures, for example and not limitation, electricity, water, and/or gas consumption. The meter 150 may send and receive communications, such as metering signals or consumption information, to and from a central unit or another meter. The central unit, in an embodiment, may be a utility responsible for providing service, such as an electricity utility. Furthermore, although the exemplary device 150 and the associated printed circuit board 100 are circular and rectangular in shape, a printed circuit board 100 employing the notch antenna 106 is not limited to any particular size or shape.

The foregoing examples have been provided merely for the purpose of explanation and are in no way to be construed as limiting of the present invention. While the invention has been described with reference to various embodiments, it is understood that the words which have been used herein are words of description and illustration, rather than words of limitation. Further, although the invention has been described with reference to particular means, materials and embodiments, the invention is not intended to be limited to the particulars disclosed but rather is intended to cover all modifications that are within the spirit and scope of the invention as defined by the appended claims.

What is claimed:

1. A printed circuit notch antenna having at least two layers for providing remote wireless communication, the printed circuit notch antenna comprising:
    a first ground plane conductor on a first layer of a printed circuit board;
    a second ground plane conductor on a second layer of the printed circuit board;
    a notch antenna formed in a portion of the first ground plane conductor, wherein the notch antenna comprises a closed end, an opened end, and two elongate side portions between the closed end and the opened end;
    a transmission line positioned on an opposite portion of the printed circuit board from the notch antenna, wherein the transmission line crosses under the portion of the printed circuit board containing the notch antenna and indirectly couples to one of the two elongate side portions of the notch antenna, and wherein the transmission line comprises an impedance-controlled circuit positioned below the notch antenna.

2. The printed circuit notch antenna of claim 1, wherein the transmission line indirectly couples to at least one of the two elongate side portions of the notch antenna through a feed-point.

3. The printed circuit notch antenna of claim 1, wherein the first layer and the second layer of the printed circuit board are resistively coupled by one or more vias passing through the printed circuit board.

4. The printed circuit notch antenna of claim 1, wherein the impedance-controlled circuit is capacitively and/or inductively coupled to the transmission line to maintain an impedance match of the transmission line.

5. The printed circuit notch antenna of claim 1, wherein the notch antenna is etched and/or embedded in a portion of the first ground plane conductor.

6. The printed circuit notch antenna of claim 1, further comprising:
   radio circuitry on the first and/or second layer and connected to the notch antenna by the transmission line; and
   a radio shield surrounding the radio circuitry and in electrical contact with the first and/or second ground plane conductor.

7. The printed circuit notch antenna of claim 6, wherein the radio circuitry comprises a wireless radio transmitter and/or a wireless radio receiver.

8. The printed circuit notch antenna of claim 1, further comprising:
   metering circuitry on the first and/or second layer for measuring consumption and relaying and/or transmitting metering information.

9. The printed circuit notch antenna of claim 1, further comprising a first intermediate layer positioned between the first layer and the second layer and comprising a first intermediate ground plane conductor, wherein the first intermediate ground plane conductor is connected to the elongate side portion opposite the elongate side portion to which the transmission line is indirectly coupled, and wherein the first intermediate ground plane conductor provides a grounded return path for the transmission line.

10. The printed circuit notch antenna of claim 9, further comprising a second intermediate layer positioned between the first intermediate layer and the second layer and comprising a second intermediate ground plane conductor, wherein the second intermediate ground plane conductor is connected to the portion of the printed circuit board containing the notch antenna, and wherein the second intermediate ground plane conductor provides a grounded return path for the transmission line.

11. The printed circuit notch antenna of claim 10, wherein the first layer and the second layer and the first intermediate layer and the second intermediate layer are electrically connected by vias.

12. The printed circuit notch antenna of claim 1, wherein the printed circuit board is oriented in a vertical plane and the notch antenna is oriented horizontally on the printed circuit board.

13. The printed circuit notch antenna of claim 1, wherein the elongate side portions of the notch antenna flare apart from the closed end to the opened end.

14. The printed circuit notch antenna of claim 1, wherein the transmission line vertically crosses under the portion of the printed circuit board containing the notch antenna.

15. The printed circuit notch antenna of claim 1, wherein the notch antenna establishes radiation current in the first ground plane conductor.

16. The printed circuit notch antenna of claim 1, wherein the opened end of the notch antenna is rounded.

17. The printed circuit notch antenna of claim 1, wherein the notch antenna comprises a first portion and a second portion, wherein the first portion and the second portion are configured to form an angle between the first portion and the second portion.

18. The printed circuit notch antenna of claim 17, wherein the angle between the first portion and the second portion is a ninety degree angle.

19. The printed circuit notch antenna of claim 17, wherein a portion of the notch antenna that terminates in the closed-end of the notch antenna is oriented horizontally on the printed circuit board.

20. A wireless device for providing remote wireless communication, the wireless device comprising:
   a base;
   a housing mounted to the base for enclosing a multi-layer printed circuit board;
   the multi-layer printed circuit board mounted within the housing and comprising:
      a first layer comprising a first ground plane conductor;
      a notch antenna formed in a portion of the first ground plane conductor, wherein the notch antenna comprises a closed end, an opened end, and two elongate side portions between the closed end and the opened end;
      a second layer positioned beneath the first layer;
      a transmission line positioned on an exterior surface portion of the printed circuit board, wherein the transmission line crosses under the portion of the printed circuit board containing the notch antenna and indirectly couples to one of the two elongate side portions of the notch antenna;
      radio circuitry on the first layer and connected to the notch antenna by the transmission line;
      a radio shield surrounding the radio circuitry and in electrical contact with the first ground plane conductor, and wherein the transmission line comprises an impedance-controlled circuit located directly beneath the notch antenna.

21. The wireless device of claim 20, wherein the wireless device comprises a meter, and wherein the printed circuit board further comprises metering circuitry positioned on the first and/or second layer.

22. The wireless device of claim 20, wherein the transmission line indirectly couples to one of the two elongate side portions of the notch antenna through a feed-point, wherein the feed-point is located at a portion along one of the two elongate side portions of the notch antenna to provide an impedance match for an impedance of the transmission line.

23. The wireless device of claim 20, wherein the second layer comprises a buried ground plane conductor to enclose the radio shield and to shield and decouple the radio circuitry.

24. The wireless device of claim 23, wherein the buried ground plane conductor does not extend and cover a portion of the printed circuit board containing the notch antenna.

25. The wireless device of claim 20, wherein the impedance-controlled circuit comprises a capacitive circuitry element in series with the portion of the transmission line that crosses under the portion of the printed circuit board containing the notch antenna and/or an inductive circuitry element in series with the portion of the transmission line that crosses under the portion of the printed circuit board containing the notch antenna.

26. The wireless device of claim 20, wherein the printed circuit board is oriented in a vertical plane and the notch antenna is oriented horizontally on the printed circuit board.

27. The wireless device of claim 20, wherein the notch antenna comprises a first portion and a second portion, wherein the first portion and the second portion are configured to form an angle between the first portion and the second portion.

28. The wireless device of claim 27, wherein the angle between the first portion and the second portion is a ninety degree angle.

29. The wireless device of claim 27, wherein a portion of the notch antenna that terminates in the closed-end of the notch antenna is oriented horizontally on the printed circuit board.

30. A method of forming an omni-directional radiation pattern for transmitting information to/from a wireless device, the method comprising:

forming a notch antenna in a ground plane of a first layer of a printed circuit board mounted in the wireless device;

connecting radio circuitry to the notch antenna through a transmission line, wherein the transmission line is formed on a second layer of the printed circuit board, extends vertically under a portion of the printed circuit board that contains the notch antenna, and indirectly couples to a side portion of the notch antenna;

matching an impedance of the transmission line by inserting an impedance-controlled circuit in series with the transmission line and positioned below the notch antenna;

radiating an omni-directional radiation pattern by allowing a current flow from the radio circuitry to the notch antenna; and communicating information to/from the wireless device.

31. The method of claim 30, wherein connecting radio circuitry to the notch antenna through a transmission line comprises:

forming a printed circuit transmission line on the second layer of the printed circuit board;

indirectly connecting the printed circuit transmission line to an edge of the notch antenna through vias; and connecting the printed circuit transmission line to the radio circuitry.

32. The method of claim 30, wherein the notch antenna is formed by etching the notch antenna in a ground plane of a first layer of a printed circuit board, wherein the notch antenna comprises a closed end, an opened end, and two elongate side portions between the closed end and the opened end.

33. The method of claim 30, further comprising:

forming a first and second intermediate layer; and electrically connecting the first and second intermediate layers to the first and second layers;

wherein the first and second intermediate layers serve as return ground planes for the transmission line.

34. A broadband notch antenna employed in a ground plane structure of a printed circuit board, the notch antenna comprising:

a notch formed in the ground plane structure of the printed circuit board, wherein the notch produces an omni-directional radiation pattern from a current flow in the ground plane structure;

a transmission line positioned on a bottom portion of the printed circuit board, wherein the transmission line crosses under the portion of the printed circuit board containing the notch and indirectly couples to the notch antenna, and wherein the transmission line comprises an impedance-controlled circuit positioned below the notch antenna; and radio circuitry adjacent to the notch antenna and connected to the notch antenna by the transmission line.

* * * * *